US008884414B2

(12) United States Patent
Lee et al.

(10) Patent No.: US 8,884,414 B2
(45) Date of Patent: Nov. 11, 2014

(54) INTEGRATED CIRCUIT MODULE WITH DUAL LEADFRAME

(71) Applicant: Texas Instruments Incorporated, Dallas, TX (US)

(72) Inventors: Lee Han Meng@Eugene Lee, Johor (MY); Anis Fauzi bin Abdul Aziz, Perlis (MY); Susan Goh Geok Ling, Melaka (MY); Ng Swee Tiang, Melaka (MY)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/737,697

(22) Filed: Jan. 9, 2013

(65) Prior Publication Data

US 2014/0191381 A1 Jul. 10, 2014

(51) Int. Cl.
*H01L 23/495* (2006.01)
*H01L 23/34* (2006.01)
*H01L 23/00* (2006.01)

(52) U.S. Cl.
CPC .......... *H01L 23/49575* (2013.01); *H01L 24/03* (2013.01)
USPC ........... 257/676; 257/670; 257/673; 257/690; 257/700; 257/724

(58) Field of Classification Search
USPC ......... 257/666, 670, 673, 676, 690, 692, 693, 257/700, 723, 724
See application file for complete search history.

(56) References Cited

U.S. PATENT DOCUMENTS

| 5,229,329 | A | 7/1993 | Chai et al. |
| 5,686,698 | A | 11/1997 | Mahadevan et al. |
| 5,789,806 | A | 8/1998 | Chua et al. |
| 6,268,646 | B1 | 7/2001 | Sugimoto et al. |
| 6,603,195 | B1 | 8/2003 | Caletka et al. |
| 7,138,673 | B2* | 11/2006 | Tanaka .......................... 257/288 |
| 7,326,041 | B2* | 2/2008 | Ochiai et al. .................. 425/116 |
| 2007/0290303 | A1 | 12/2007 | Lange |
| 2011/0074007 | A1 | 3/2011 | Lopez et al. |
| 2011/0089546 | A1* | 4/2011 | Bayan ........................... 257/676 |
| 2011/0095411 | A1 | 4/2011 | Herbsommer et al. |
| 2011/0140249 | A1 | 6/2011 | Lee et al. |
| 2011/0140262 | A1 | 6/2011 | Lee et al. |
| 2012/0015483 | A1 | 1/2012 | Herbsommer et al. |
| 2012/0056311 | A1* | 3/2012 | Bai et al. ....................... 257/676 |

OTHER PUBLICATIONS

Lee Han Meng@Eugene Lee, Yien Sien Khoo, Kuan Yee Woo; U.S. Appl. No. 13/210,135, filed Aug. 15, 2011 for "Flexible Routing for High Current Module Application", 28 pages.

* cited by examiner

*Primary Examiner* — Thanh V Pham
(74) *Attorney, Agent, or Firm* — Steven A. Shaw; Frederick J. Telecky, Jr.

(57) ABSTRACT

An integrated circuit module including a generally flat die attachment pad (DAP) positioned substantially in a first plane; and a generally flat lead bar positioned substantially in a second plane above and parallel to said first plane and having at least one downwardly and outwardly extending lead bar lead projecting therefrom and terminating substantially in the first plane; a top leadframe having a plurality of generally flat contact pads positioned substantially in a third plane above and parallel to the second plane and a plurality of leads having proximal end portions connected to the pad portions and having downwardly and outwardly extending distal end portions terminating substantially in said first plane; an IC die connected to the top leadframe, and the DAP; and encapsulation material encapsulating at least portions of the DAP, the lead bar, the top lead frame, and the IC die.

9 Claims, 9 Drawing Sheets

INTEGRATED CIRCUIT MODULE WITH DUAL LEADFRAME

BACKGROUND

Integrated circuit (IC) packages typically include an IC die attached to a lead frame that enables contacts on the die to be attached to exterior circuits. The die and portions of the leadframe are often encapsulated in a covering of epoxy or other material that protects the die and leadframe. As IC dies have become smaller over time the number and density of contacts on the dies have increased. As a result, signal routing within the IC packages and heat dissipation from IC packages has become challenging. One recent development is the dual leadframe IC package in which more than one leadframe is provided in a single package to increase signal routing options. However, dual leadframe packages often pose added challenges of their own, such as a tendency of the two leadframes to make undesired electrical contact with each other. Such contact may result in a short circuit and package failure.

DETAILED DESCRIPTION

Figure 1:
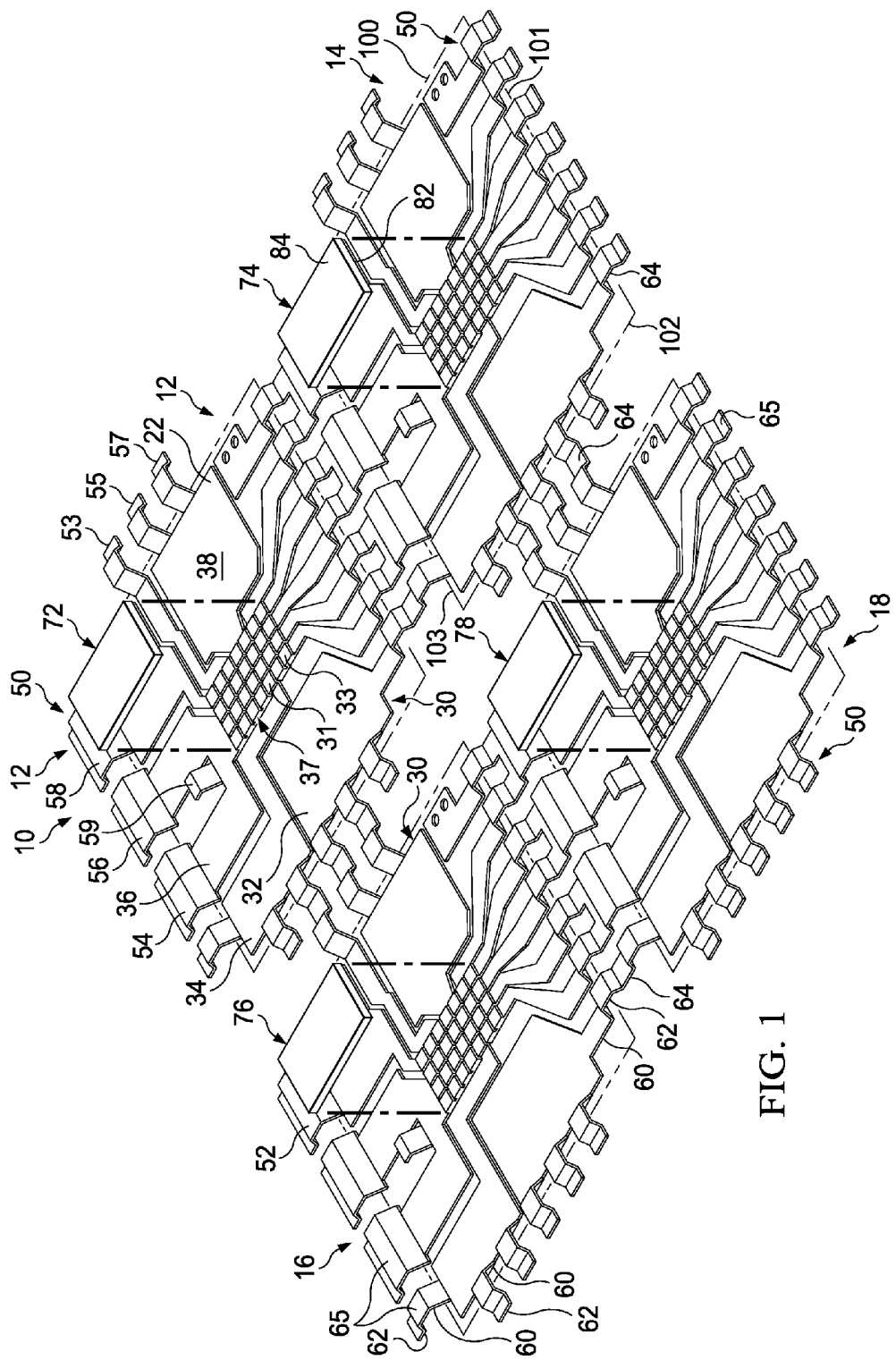
FIG. 1 is a bottom isometric view of a top lead frame strip and flipchip dies.

FIG. 1 is a bottom isometric view of a top lead frame strip 10 having integrally connected top lead frames 12, 14, 16, 18. The top lead frame strip 10 has a bottom surface 22 and a top surface 24, FIG. 3. Each top lead frame 12, 14, etc., has a plurality of generally coplanar contact pad portions 30 including individual contact pads 31, 32, 33, 34, 36, 38, etc. Some of the contact pads, e.g., 31, 33, etc., are mounted in a generally rectangular die mounting area 37 of each top lead frame, e.g., 12. Each lead frame also comprises a plurality of peripheral lead portions 50 which may comprise a plurality of relatively large lead portions 52, 54, 56, 58 and a plurality of relatively small lead portions 53, 55, 57, etc. One or more interior lead portions 59 may also be provided on each top leadframe 12, etc. Interior lead portion 59 may be attached to the die attachment pad (DAP) portion 130 of a bottom leadframe 110, described below. Each peripheral lead portion 50 has a proximal end 60 attached to at least one contact pad portion 30 and also comprises a downwardly and outwardly extending distal end 62. At least some of the peripheral lead portions 50 comprise connector extensions 64, 65, which may have a generally inverted U-shape or an inverted L-shape depending upon whether there is an adjacent connected leadframe. The connector extensions 64, 65 facilitate attachment of the top leadframe strips 10 to bottom leadframe strips 110, FIG. 3. The connector extensions 64, 65 may comprise other shapes adapted to facilitate connection between top and bottom leadframe strips 10, 110.

Figure 2:
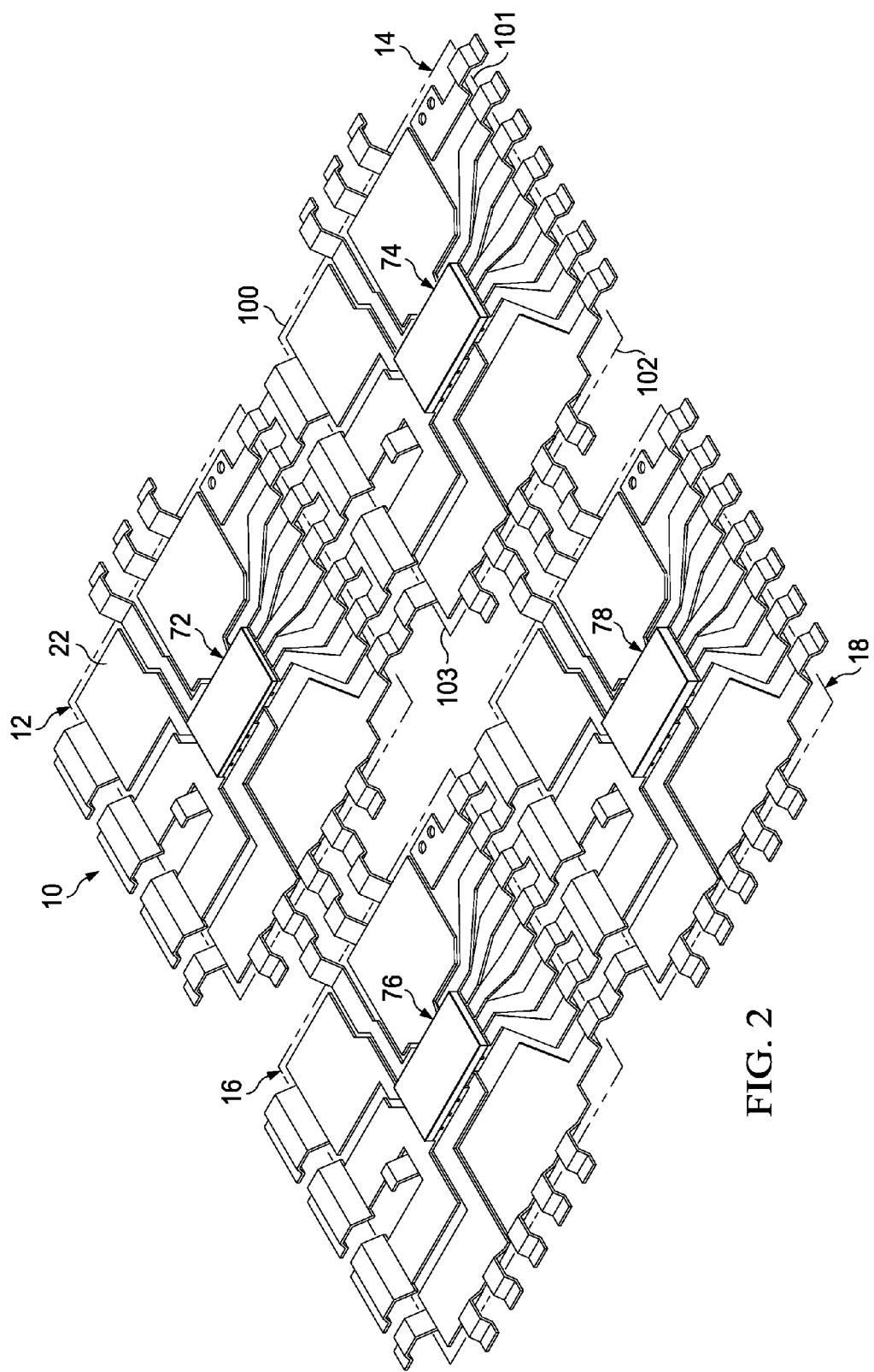
FIG. 2 is a bottom isometric view of the lead frame strip of FIG. 1 with flipchips mounted on each lead frame.

With reference to FIGS. 1 and 2, a plurality of flipchips 72, 74, 76, 78 are mounted on the top lead frames 12, 14, 16, 18 respectively. Each flipchip has a first or active side 82 and a second or inactive side 84 as best seen in the cross sectional view of FIG. 7. The active side 82 has a plurality of solder bumps 85, 87, 89, etc., formed thereon in a rectangular grid pattern. Each of the solder bumps is bonded to an associated contact pad portion, e.g. 31, 33 in die mounting region 37 during reflow heating. The top lead frame strip 10 may be moved to a reflow oven (not shown) for soldering the flipchips 72, etc. to the top leadframes 12, etc., when in the configuration shown in FIG. 2, which is prior to attachment of the top lead frame strip 10 to a bottom lead frame strip.

Figure 3:
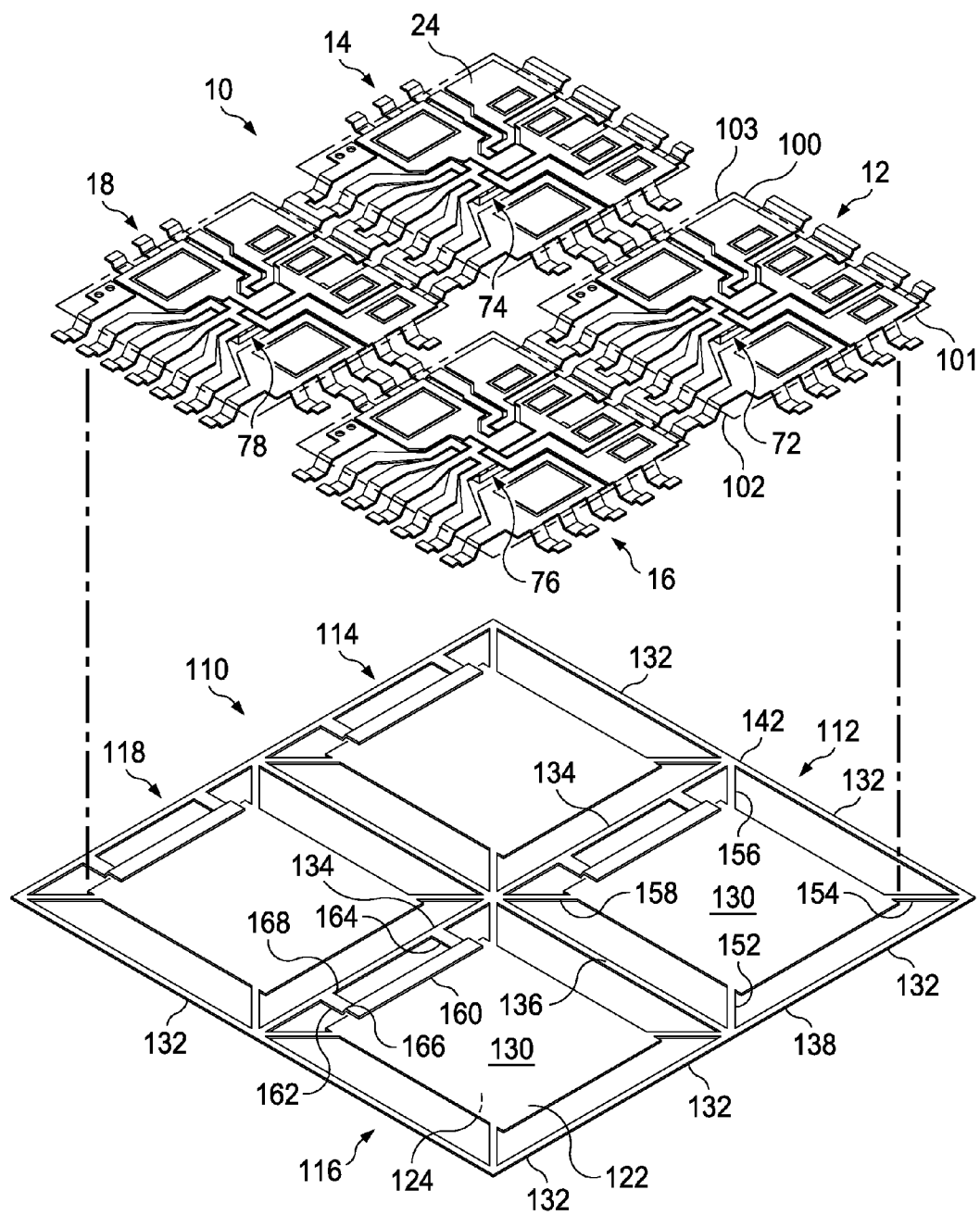
FIG. 3 is a top isometric view of a top lead frame strip and bottom lead frame strip prior to attachment.

FIG. 3 illustrates a bottom lead frame strip 110 having interconnected bottom lead frames 112, 114, 116, 118. The bottom lead frame strip 110 has a top surface 122 and a bottom surface 124. A die attachment pad (DAP) portion 130 is connected to a peripheral frame portion 132 which may be formed by a plurality of elongate frame members 134, 136, 138, 142. Each DAP portion 130 is circumscribed by an associated peripheral frame portion 132. The DAP portion 130 is connected to the surrounding peripheral frame portion 132 by a plurality of tie bars 152, 154, 156, 158. Each bottom lead frame 112, 114, etc., comprises an elongate lead bar 160 which is positioned in a plane parallel to and above a plane in which the DAP portion 130, peripheral frame portion 132 and tie bar portions 152, etc. are positioned. A first lead bar lead portion 162 and a second lead bar lead portion 164 are attached to opposite ends of the lead bar 160. Lead bar lead portions 162, 164 are integrally formed with and attached at distal ends thereof to an elongate side member 134 of the associated peripheral frame portion 132. Thus, the distal end 168 at each lead bar lead portion 162, 164 is positioned substantially in the same plane as the DAP portion 130 and peripheral frame portion 132. When the top and bottom leadframes, e.g. 16, 116, are connected as described below, the lead bar 160 is positioned substantially in the same plane as the top leadframe contact pad portions 30 and engages the bottom surface of at least one of the contact pad portions 30.

The top lead frame strip 10 after attachment of the flipchips 72, 74, 76, 78 thereto is attached, bottom surface 22 down, to the bottom lead frame strip 110 to form a dual leadframe strip 170. This is done, in one embodiment, by placing solder paste on the peripheral frame portions 132 and the lead bars 160 of the bottom lead frame strip 110 and then positioning the connector extensions 64, 65 of the top leadframe peripheral lead portions 50 in contact with the associated peripheral frame portions 132 and the bottom leadframe lead bars 160 into contact with the top leadframe contact pad portions 130. The top lead frame strip 10 "nests" on the bottom lead frame strip 110 through a positive and locating engagement of the lead portion connector extensions 64, 65 with the peripheral frame portions 132. The distal ends 62 of each of the top lead frame peripheral lead portions 50 and the lead bar lead portions 162, 164 act as vertical spacers in the dual lead frame strip assembly 170 shown in FIG. 4. The peripheral lead portions 50 of the top leadframes 10, 12, etc., also co-act with the peripheral frame portions 132 of the bottom leadframes 110, 112, etc. for proper lateral and angular positioning of the leadframes. The lead distal end portions 62 and the lead bar lead portions 162, 164 hold the top lead frame contact pad portions 30 at a predetermined height above the bottom lead frame DAP portions 130 and peripheral frame portions 132. The lead distal end portions 62 also hold the contact pad portions 30 in a generally laterally centered relationship with respect to the peripheral frame portions 132 of each bottom lead frame 112, 114, 116, 118.

Figure 4:
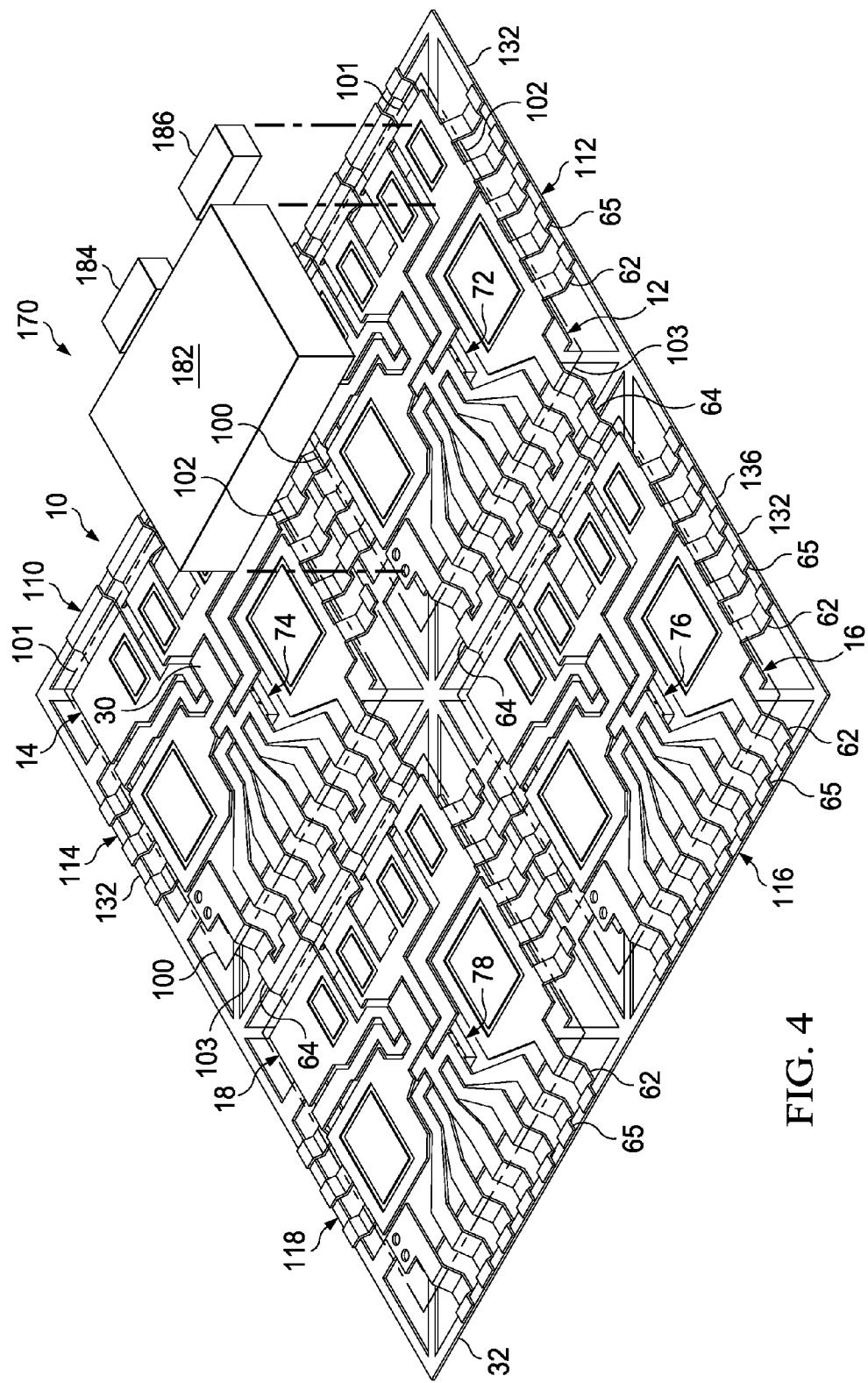
FIG. 4 is a top isometric view of attached top and bottom lead frame strips and flipchip dies attached therebetween and further showing the mounting of discrete circuit components on one top lead frame.
Figure 5:
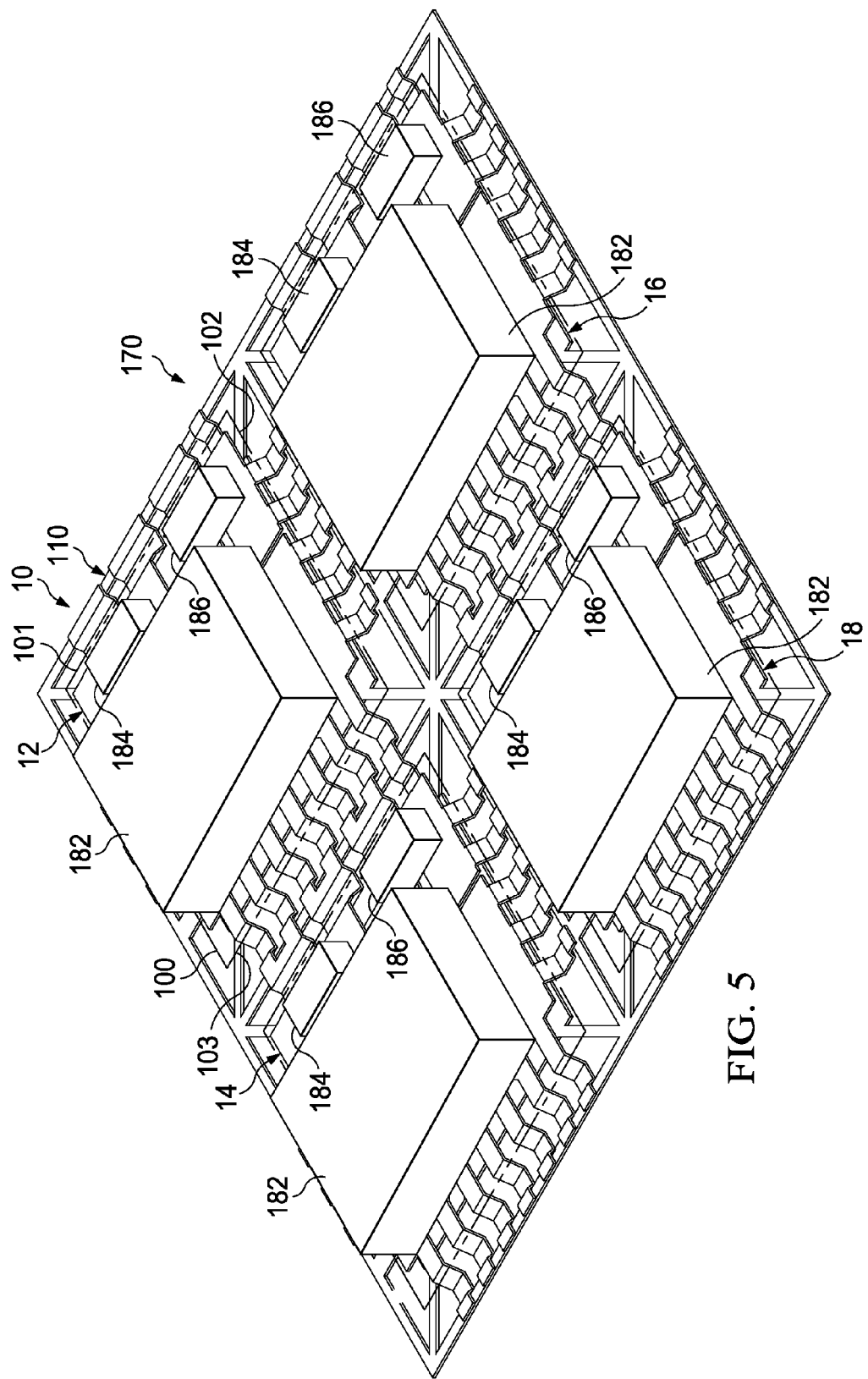
FIG. 5 is a top isometric view of attached top and bottom lead frame strips of FIG. 4 with discrete circuit components mounted on each top lead frame thereof.

Next, as further illustrated by FIG. 4, a plurality of discrete components which may be passive circuit components 182, 184, 186 may be mounted on the top surface of each top lead frame 12, 14, 16, 18. This may be accomplished by first applying solder paste to associated contact pad portions 30 of each top lead frame. The discrete circuit components 182, 184, 186 are then solder bonded to the associated top lead frames, e.g., 16, by placing the dual lead frame strip 170 in a reflow oven. In one method, the reflow heating of the solder paste beneath each discrete component 182, 184, 186 may take place at the same time as reflowing of the solder paste on the peripheral frame portions 132, etc. In another embodiment, the solder paste on the bottom lead frame is reflowed in a first operation before the discrete members 182, 184, 186 are placed on the associated top lead frames, e.g., 16. FIG. 5 illustrates the dual lead frame strip 170 after mounting of the discrete components 182, 184, 186 on each top lead frame 12, 14, 16, 18.

Figure 6:
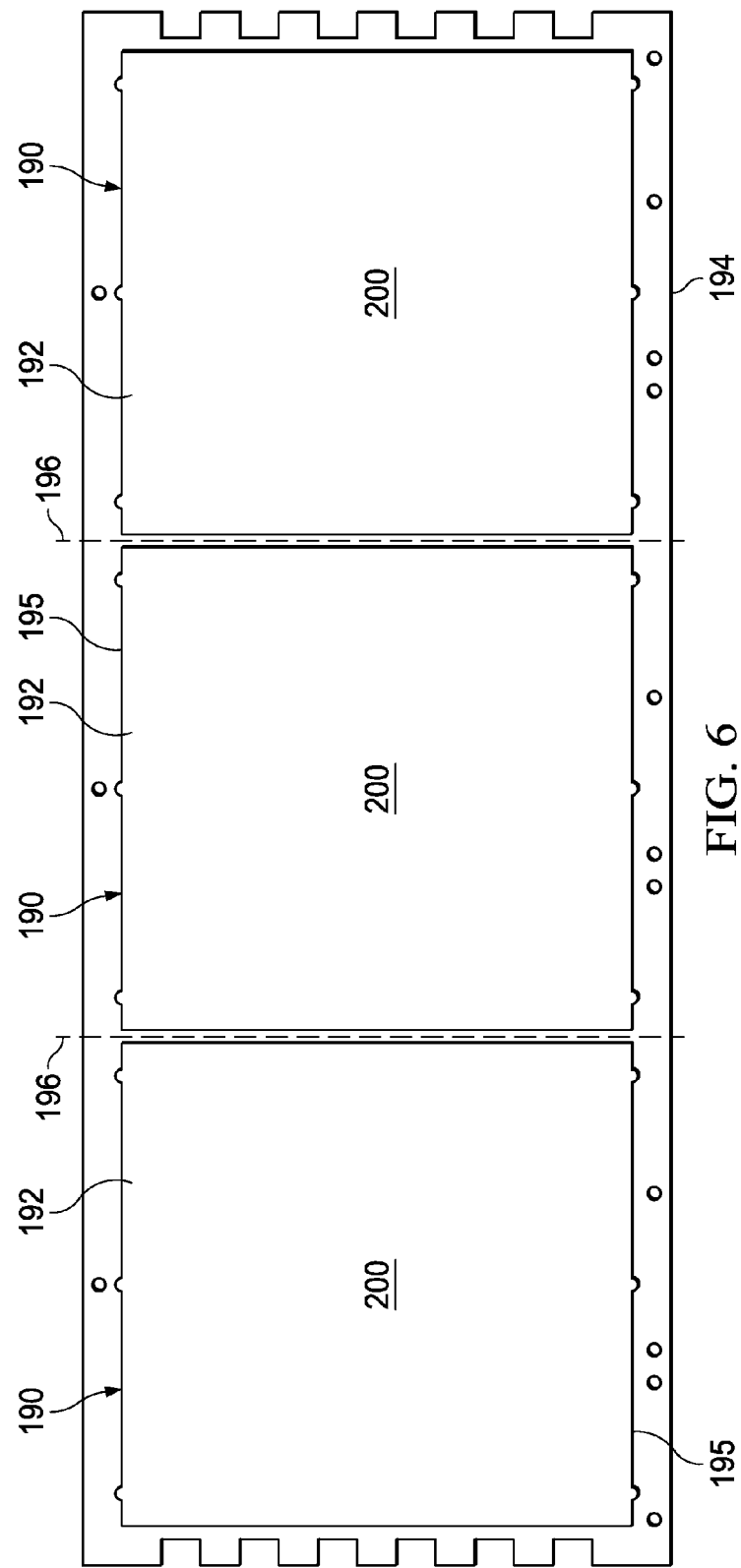
FIG. 6 is a top isometric view of three encapsulated dual lead frame assemblies such as shown in FIG. 5.

Next, the dual lead frame assembly 170 of FIG. 5 is placed on a support frame 194, FIG. 6, and is moved to an encapsulation station such as a transfer mold station where mold compound is applied to the dual lead frame strip assembly 170 to provide an encapsulated dual lead frame strip 190. At least portions of the top and bottom lead frame strips 10, 110 and the flipchips 72, 74, etc. and the passive circuit components 182, 184, 186 are covered with encapsulating material 200 such as conventional mold compound which cures to provide a hard protective covering. The encapsulated dual lead frame strip 190 thus formed may be of various sizes and lengths depending upon the size and length of the top and bottom lead frames 10, 110 that were initially attached together. The encapsulated dual lead frame strip 190 illustrated in FIG. 6 has three, 2×2 dual lead frame assemblies 170 covered with encapsulating material 200. The encapsulated dual lead frame strip 190 has a generally flat top surface 192 and flat bottom (not shown) and side surfaces 195. The dashed lines shown at 196 represent the boundaries of three 4×4 encapsulated dual lead frame strips 190.

Next, each 4×4 encapsulated leadframe assembly 190 is singulated along the saw streets 100, 101, 102, 103, FIGS. 1-5, around each individual attached top and bottom leadframe assembly, e.g. 12, 112.

Figure 7:
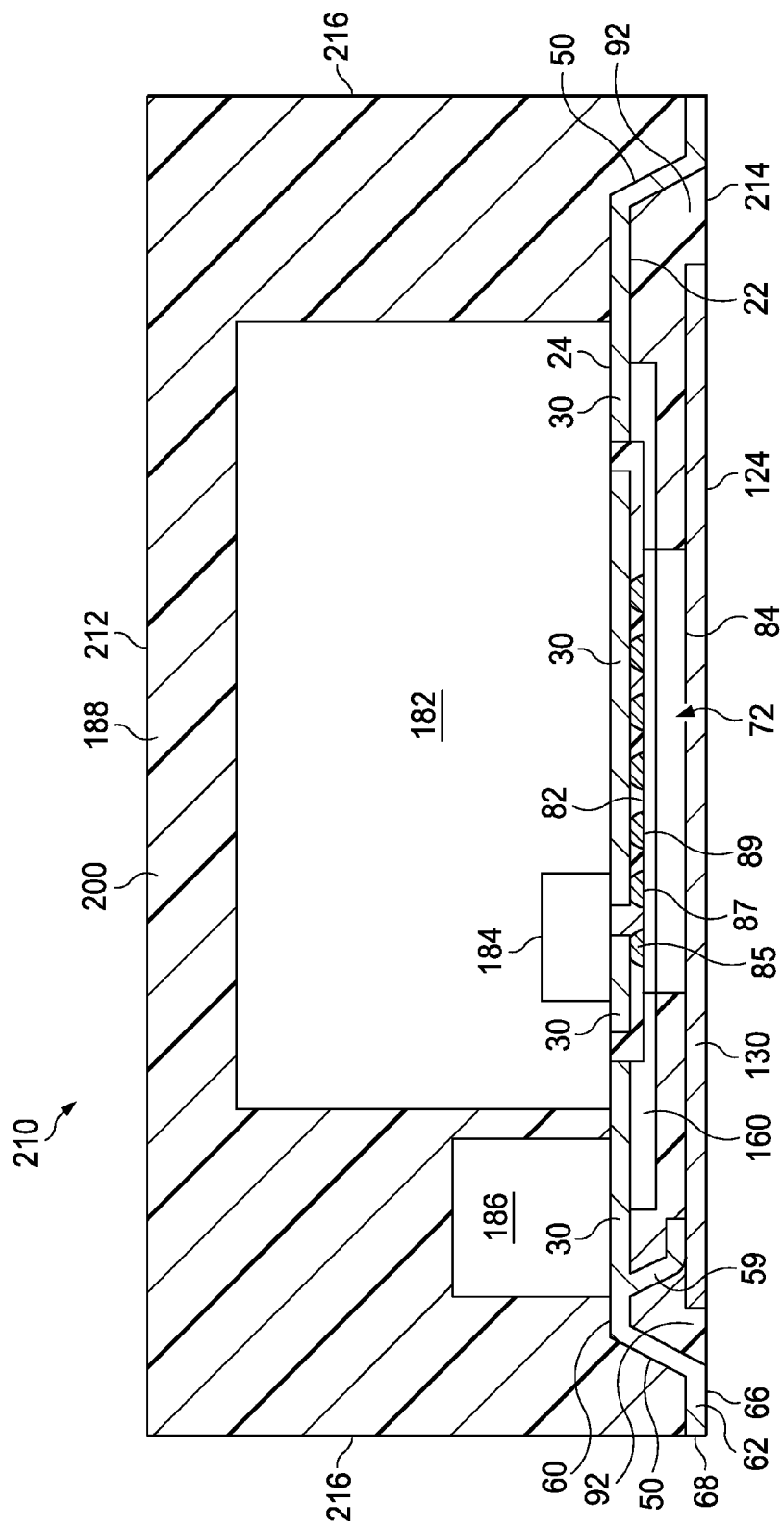
FIG. 7 is a cross sectional side elevation view of an integrated circuit package singulated from a molded dual lead frame assembly such as shown in FIG. 6.
Figure 9:
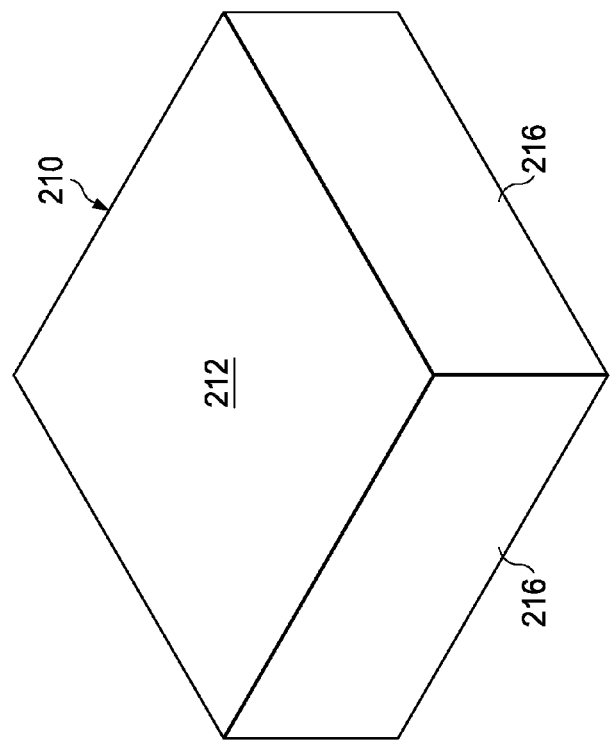
FIG. 9 is a top isometric view of the integrated circuit package shown in FIGS. 7 and 8.
Figure 8:
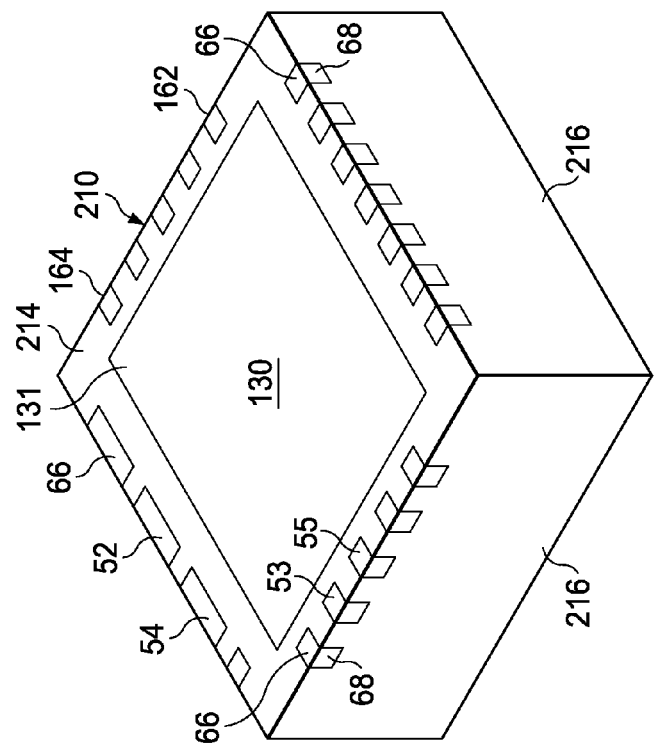
FIG. 8 is a bottom isometric view of the integrated circuit package shown in FIG. 7.

As best shown in FIGS. 7, 8 and 9, the singulation of an encapsulated dual lead frame strip 190 provides a plurality of individual integrated circuit (IC) packages 210, each having a flat top face 212, a flat bottom face 214 and a plurality of flat side faces 216. A bottom surface 131 of a DAP portion 130 is exposed at the bottom face 214 of each IC package. Also exposed on the bottom face 214 and side faces 216 are bottom surface portions 66 and terminal end surface portions 68 of the top lead frame lead portions 50 including smaller lead portions 53, 55, etc. as well as larger lead portions 52, 54, etc. Also, exposed are surface portions of bottom lead frame lead portions 162, 164. The exposed bottom surface 131 of the DAP portion 130 may be substantially flush with the bottom face 214 of the encapsulating layer 200. The exposed surfaces of the severed distal end portions 62 of the top leadframe peripheral leads 50 and of the severed distal end portion 168 of each lead bar lead portion 162, 164 may be substantially flush with the bottom face 214 and side faces 216 of said encapsulating layer 200.

As a result of the described method of attachment of each top leadframe, e.g. 12 to each bottom lead frame, e.g. 112, and the subsequent singulation and removal of outer ends of peripheral lead portions 50 and the attached peripheral frame portion 132, a significant gap 92, FIG. 7, is provided between the DAP portion 130 and the nearest outwardly extending peripheral lead portion 50. Thus, a common dual leadframe problem of top leadframes leads making undesired contact with and shorting out on the bottom lead frame is obviated. It will also be appreciated that by providing the described bottom leadframe lead bar configuration or similar structure that additional signal routing options are provided to the package designer. Although in the specifically described embodiments only one lead bar and two additional leads are provided it is to be understood that additional leads and thus additional signal routing options could be provided.

Figure 10:
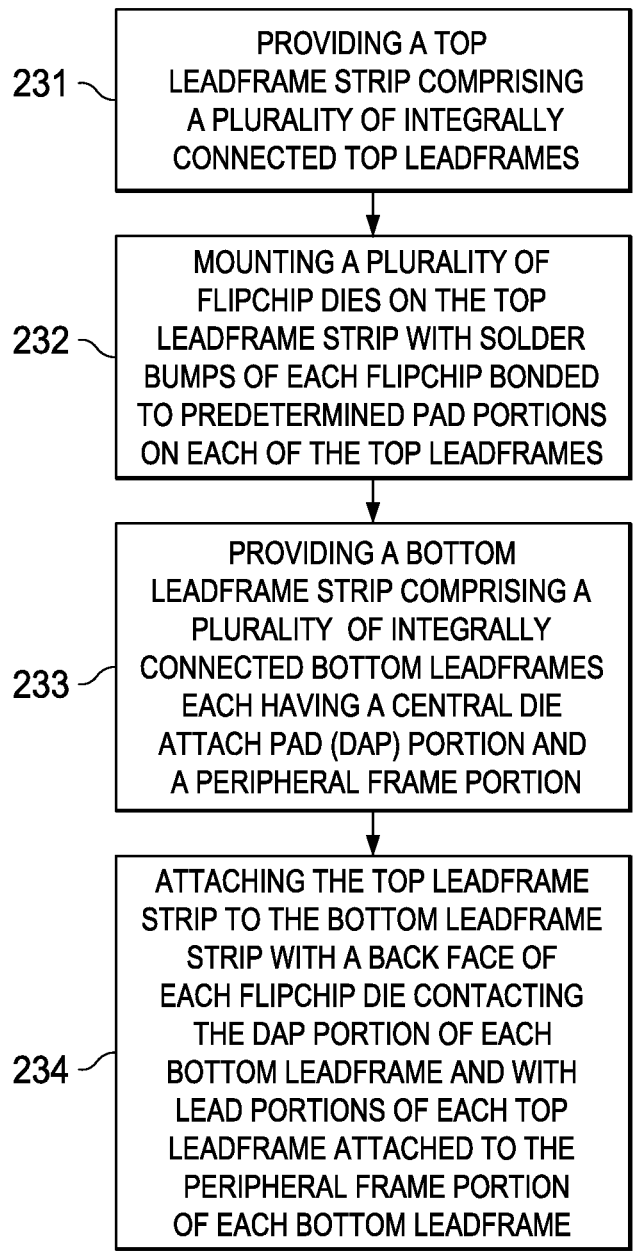
FIG. 10 is a flow chart of one embodiment of a method of making integrated circuit modules.

FIG. 10 illustrates a method of making integrated circuit packages. As shown in FIG. 10, the method includes, as shown at block 231, providing a top leadframe strip 10 comprising a plurality of integrally connected top leadframes 12, 14, etc. The method also includes, as shown at 232, mounting a plurality of flipchip dies 72, 74, etc., on the top leadframe strip 10 with solder bumps 85, 87, etc., of each flipchip die bonded to predetermined contact pad portions 30 on each of the top leadframes 12, 14, etc. The method further includes, as shown at 233, providing a bottom leadframe strip 110 comprising a plurality of integrally connected bottom leadframes 112, 114, etc., each having a central die attach pad (DAP) portion 130 and a peripheral frame portion 132. The method also includes, as shown at block 234, attaching the top leadframe strip 10 to the bottom leadframe strip 110 with a back face 84 of each flipchip die 72, etc., contacting the DAP portion 130 of each bottom leadframe 112, 114, etc., and with peripheral lead portions 50 of each top leadframe 12, 14, etc., attached to the peripheral frame portion 132 of each bottom leadframe 112, 114, etc.

While certain specific embodiments of an integrated circuit module and methods of making such modules have been disclosed herein, many other embodiments of the disclosed modules and methods will occur to those skilled in the art after reading this disclosure. It is intended that the appended claims be broadly interpreted to cover such other embodiments, except to the extent limited by the prior art.

What is claimed is:

1. An integrated circuit module comprising:
   a generally flat die attachment pad (DAP) positioned substantially in a first plane;
   a generally flat lead bar positioned substantially in a second plane above and parallel to said first plane and having at least one downwardly and outwardly extending lead bar lead projecting therefrom and terminating substantially in said first plane;
   a top leadframe comprising a plurality of generally flat contact pads positioned substantially in a third plane above and parallel to said second plane and a plurality of leads having proximal end portions connected to portions of said contact pads and having downwardly and outwardly extending distal end portions terminating substantially in said first plane;
   an IC die comprising a plurality of electrical contacts connected to at least some of said plurality of contact pads of said top leadframe, and a surface attached to said DAP; and encapsulation material encapsulating at least portions of said DAP, said lead bar, said top lead frame, and said IC die.

2. The integrated circuit module of claim 1, said IC die comprising a flipchip having a first side with a plurality of solder bumps thereon operably electrically connected to some of said plurality of contact pads of said top leadframe and having a second side opposite said first side comprising said surface connected to said DAP.

3. The integrated circuit module of claim 1, said top leadframe comprising at least one lead having a proximal end connected to at least one of said plurality of contact pads and a distal end connected to said DAP.

4. The integrated circuit module of claim 1, said generally flat lead bar being connected to said top leadframe.

5. The integrated circuit module of claim 1, at least one passive component electrically and physically connected to at least one of said contact pads on said top leadframe.

6. The integrated circuit module of claim 1, said encapsulation layer having a generally rectangular box shape with generally flat top, bottom and side faces, with a bottom surface of said DAP exposed at said bottom face and said distal end portions of said plurality of top leadframe leads and a distal end portion of said at least one downwardly and outwardly extending lead bar lead being exposed at said bottom face and said side faces of said encapsulating layer.

7. The integrated circuit module of claim 6, said exposed bottom surface of said DAP being substantially flush with said bottom face of said encapsulating layer and said exposed surfaces of said distal end portions of said top leadframe leads and said distal end portion of said lead bar lead being substantially flush with said bottom face and said side faces of said encapsulating layer.

8. An intermediate product made in the production of an integrated circuit module comprising:

a bottom leadframe comprising:

a generally flat peripheral frame portion positioned substantially in a first plane;

a generally flat die attachment pad (DAP) portion circumscribed by said peripheral frame portion and positioned substantially in said first plane; and at least one bottom leadframe lead portion having a first end connected to said peripheral frame portion and a second end positioned upwardly and inwardly from said peripheral frame portion and a top leadframe comprising:

a plurality of generally flat, contact pad portions positioned substantially in a second plane parallel to and above said first plane;

a plurality of downwardly and outwardly extending top leadframe peripheral lead portions having proximal ends connected to said contact pads and distal ends connected to said bottom leadframe peripheral frame portion; and wherein said second end of said bottom leadframe lead portion is connected to said top leadframe.

9. The intermediate product of claim 8 wherein said distal end portions of said outwardly extending top leadframe lead portions comprise integrally formed connector extensions, said peripheral frame portion nesting in said connector extensions of said lead portions at a predetermined distance from said contact pad portions.

* * * * *